United States Patent
Hikmet et al.

(10) Patent No.: US 8,829,551 B2
(45) Date of Patent: Sep. 9, 2014

(54) TL RETROFIT LED MODULE INSIDE SEALED GLASS TUBE

(75) Inventors: Rifat Ata Mustafa Hikmet, Eindhoven (NL); Jan Cornelis Kriege, Mierlo (NL); Johannes Franciscus Maria Cillessen, Deurne (NL); René Theodorus Wegh, Veldhoven (NL); Pieter Joseph Clara Van Der Wel, Heerlen (NL); Rene Maarten Arjan Driessens, Shanghai (NL)

(73) Assignee: Koninklijke Philips N.V., Eindhoven (NL)

( * ) Notice: Subject to any disclaimer, the term of this patent is extended or adjusted under 35 U.S.C. 154(b) by 4 days.

(21) Appl. No.: 13/806,305

(22) PCT Filed: Jun. 30, 2011

(86) PCT No.: PCT/IB2011/052874
§ 371 (c)(1),
(2), (4) Date: Dec. 21, 2012

(87) PCT Pub. No.: WO2012/001645
PCT Pub. Date: Jan. 5, 2012

(65) Prior Publication Data
US 2013/0092969 A1    Apr. 18, 2013

(30) Foreign Application Priority Data

Jul. 1, 2010   (EP) .................................... 10168119

(51) Int. Cl.
*H01L 33/00* (2010.01)
*H01L 33/50* (2010.01)
*F21V 3/00* (2006.01)
*F21K 99/00* (2010.01)
*F21V 31/03* (2006.01)
*H01L 33/56* (2010.01)
*H01L 25/075* (2006.01)
*F21Y 101/02* (2006.01)
*F21Y 103/00* (2006.01)

(52) U.S. Cl.
CPC ............. *H01L 33/50* (2013.01); *H01L 33/507* (2013.01); *F21V 31/03* (2013.01); *Y02B 20/386* (2013.01); *F21V 3/00* (2013.01); *H01L 33/56* (2013.01); *H01L 25/0753* (2013.01); *F21K 9/56* (2013.01); *F21Y 2101/02* (2013.01); *F21K 9/135* (2013.01); *F21K 9/17* (2013.01); *F21Y 2103/003* (2013.01)
USPC .. 257/98; 257/99; 257/E23.137; 257/E51.018

(58) Field of Classification Search
CPC ............................. H01L 33/50; H01L 33/502
USPC ....................... 257/98, 99, E23.137, E51.018
See application file for complete search history.

(56) References Cited

U.S. PATENT DOCUMENTS 7,045,861 B2 * 5/2006 Takayama et al. ............ 257/347
7,560,820 B2   7/2009 Amiotti et al.
(Continued)

FOREIGN PATENT DOCUMENTS

DE   202007017882 U1   4/2008
JP        2004362819 A  12/2004
(Continued)

*Primary Examiner* — Andy Huynh
(74) *Attorney, Agent, or Firm* — Yuliya Mathis

(57) ABSTRACT

This invention relates to a light emitting diode device (100) including an outer casing (102), a light emitting diode element (114), which includes at least one light emitting diode (114a), arranged within the outer casing, a light outlet member (108) constituting a part of the outer casing, a sealed cavity (104) containing a controlled atmosphere, and a seal (110) arranged to seal the cavity. The light emitting diode device further comprises a remote organic phosphor element (116) arranged in the sealed cavity.

14 Claims, 4 Drawing Sheets

(56) References Cited

U.S. PATENT DOCUMENTS

| | | |
|---|---|---|
| 2004/0201990 A1 | 10/2004 | Meyer |
| 2005/0029931 A1 | 2/2005 | King et al. |
| 2005/0230691 A1* | 10/2005 | Amiotti et al. .................. 257/79 |
| 2005/0254264 A1 | 11/2005 | Sidwell et al. |
| 2009/0102357 A1 | 4/2009 | Koyama |
| 2010/0134047 A1 | 6/2010 | Hasnain |

FOREIGN PATENT DOCUMENTS

| | | |
|---|---|---|
| WO | 2004100213 A2 | 11/2004 |
| WO | 2009037053 A1 | 3/2009 |

* cited by examiner

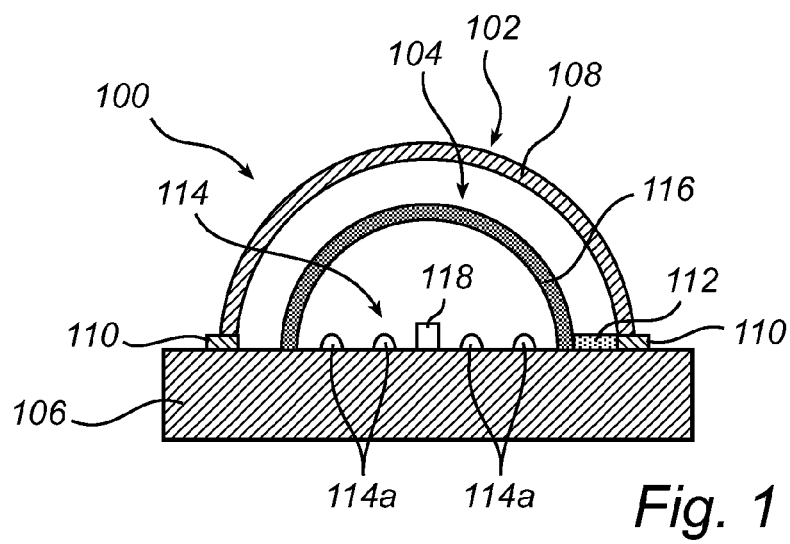
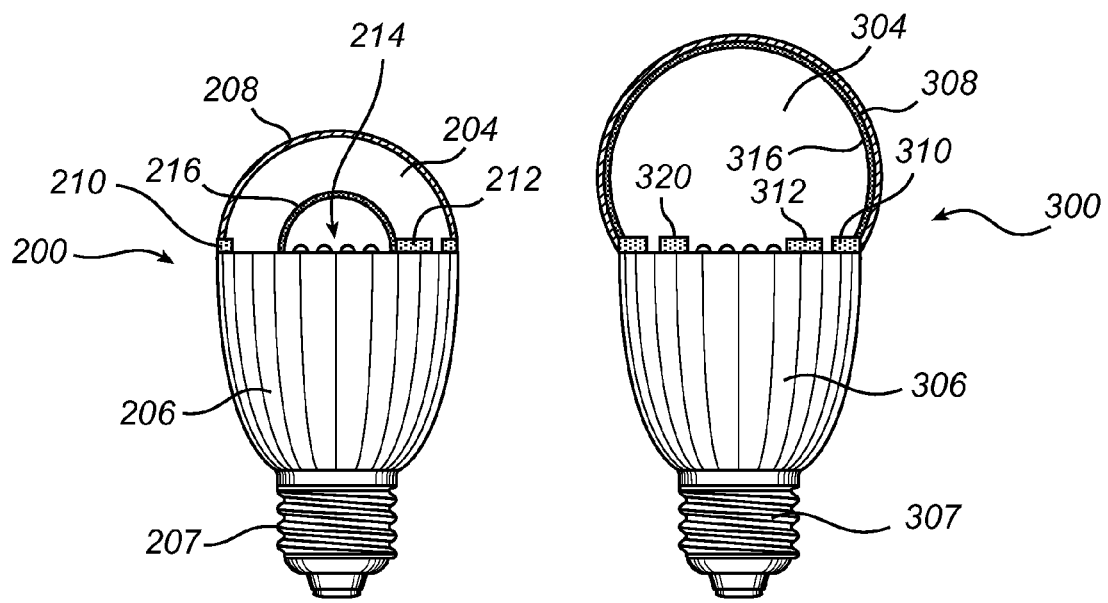
Fig. 1
Fig. 2  Fig. 3

TL RETROFIT LED MODULE INSIDE SEALED GLASS TUBE

FIELD OF THE INVENTION

The present invention relates to a light emitting diode (LED) device comprising an outer casing, a light emitting diode element arranged within the outer casing, a light outlet member constituting a part of the outer casing, a sealed cavity containing a controlled atmosphere and a phosphor element arranged in the cavity.

BACKGROUND OF THE INVENTION

The use of organic phosphors is advantageous in relation to inorganic phosphors, e.g. with regard to designing the position and bandwidth of the luminescence spectrum thereof. Unfortunately, organic phosphors have turned out to be sensitive to ambient substances, such as oxygen and water, which prematurely degrades the phosphor. Efforts have been made to solve this problem. U.S. Pat. No. 7,560,820 discloses a light emitting diode (LED) comprising a closed structure which encloses a cavity with a controlled atmosphere. In the cavity there are arranged an emitter element, phosphor arranged close to the emitter element, and a getter. It is desirable to obtain a similar larger scale structure with one or more LEDs.

SUMMARY OF THE INVENTION

It is an object of the present invention to provide a LED device that has such a larger scale structure.

This object is achieved by a LED device according to the present invention as defined in claim 1.

Thus, in accordance with an aspect of the present invention, there is provided a light emitting diode device comprising an outer casing, a light emitting diode element, comprising at least one light emitting diode, arranged within the outer casing, a light outlet member constituting a part of the outer casing, a sealed cavity containing a controlled atmosphere, and a seal arranged to seal the cavity. The light emitting diode device further comprises a remote organic phosphor element arranged in the sealed cavity. The remote organic phosphor element makes it possible to achieve a large light outlet surface, which is providable in many different shapes and which has an evenly spread light output in spite of small spots of intense light generators.

In accordance with an embodiment of the light emitting diode device, a getter is arranged in the cavity. Thereby, for example, the seal does not have to be hermetic, or gases produced during the operation of the device that would degrade the remote organic phosphor element are removable.

In accordance with an embodiment of the light emitting diode device, the getter is arranged to remove oxygen from the controlled atmosphere.

In accordance with an embodiment of the light emitting diode device, the getter is arranged adjacent to the seal.

In accordance with an embodiment of the light emitting diode device, the getter is arranged in a position where it does not interfere with an output light path.

In accordance with an embodiment of the light emitting diode device, the seal is permeable to oxygen. Due to the getter there is no need for a costly hermetic seal, although the permeability is kept low.

In accordance with an embodiment of the light emitting diode device, the organic phosphor element is a separate element. Thereby shape and positioning of the phosphor element can be optimized.

In accordance with an embodiment of the light emitting diode device, the light emitting diode device comprises a base part, wherein the light outlet member comprises an outer shell, which is attached to the base part by means of the seal, wherein the light emitting diode element is arranged on the base part, wherein the organic phosphor element constitutes a hood, which is attached to the base part, which covers the light emitting diode element, and which is arranged between the light emitting diode element and the outer shell, and wherein the getter is arranged on the base part between the organic phosphor element and the outer shell.

In accordance with an embodiment of the light emitting diode device, the light outlet member comprises an outer wall and an inner wall, attached to the outer wall by means of the seal, thereby forming the cavity. The organic phosphor element and the getter are arranged in the cavity between the walls. The light emitting diode device comprises a further compartment, which houses the light emitting diode element. Thereby it is possible to provide the sensitive phosphor element in a separate cavity, and the further compartment can be provided with for instance air or some other gas, but it does not have to be sealed from the environment.

In accordance with an embodiment of the light emitting diode device, the light outlet member forms a lid covering a further compartment, wherein the further compartment comprises a surrounding wall and a bottom plate, wherein the surrounding wall extends between the bottom plate and the light outlet member, and wherein the light emitting diode element is arranged on the bottom plate.

In accordance with an embodiment of the light emitting diode device, the outer casing is arranged as a retrofit lamp. The phrase retrofit lamp is common to the person skilled in the art and means a LED based lamp having an outer appearance of an older type of lamp which did not have a LED.

In accordance with an embodiment of the light emitting diode device, the light outlet member comprises a cylindrical glass tube, wherein the outer casing further comprises end caps attached to the cylindrical glass tube by means of the seal. This embodiment can be arranged as for example a retrofit TL tube.

In accordance with an embodiment of the light emitting diode device, the controlled atmosphere comprises a reactant gas arranged to react with a substance that is likely to be produced within the sealed atmosphere during the operation of the light emitting diode device. This embodiment has the advantage that a substance which is produced within the cavity, and which would cause a gradually deteriorated function, will be rendered harmless due to the reactant gas. The type of gas will be matched with the substance.

In accordance with an embodiment of the light emitting diode device, it comprises a dispenser arranged to dispense the reactant gas. In certain applications it will be advantageous to dispense the reactant gas bit by bit.

In accordance with an embodiment of the light emitting diode device, the dispenser is a hydrogen gas dispenser. Thereby any oxygen that occurs in the cavity is caused to react with the hydrogen and form moisture, which can then be collected by the getter by means of an appropriate moisture capturing material.

These and other aspects, features, and advantages of the invention will be apparent from and elucidated with reference to the embodiments described hereinafter.

BRIEF DESCRIPTION OF THE DRAWINGS

The invention will now be described in more detail and with reference to the appended drawings in which:

FIG. 1 is a cross-sectional view of an embodiment of a light emitting diode device according to the present invention;

FIGS. 2 and 3 are cut away side views of further embodiments of a light emitting diode device according to the present invention;

DESCRIPTION OF PREFERRED EMBODIMENTS

Figure 4:
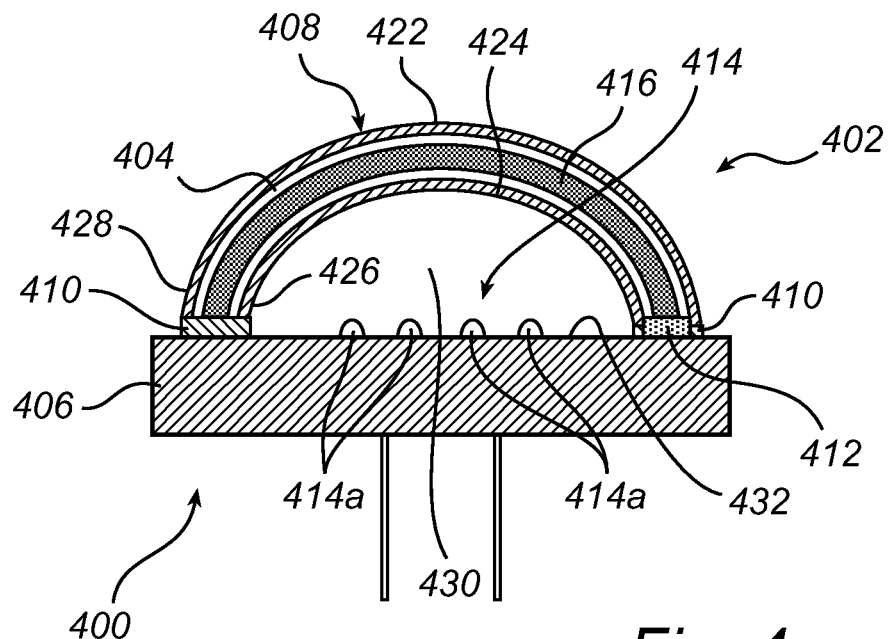
FIGS. 4 to 6 are cross-sectional views of further embodiments of a light emitting diode device according to the present invention.

In FIG. 1 an embodiment of the light emitting diode (LED) device 100 is shown in a cross-sectional view and seen from the side. The LED device 100 comprises an outer casing 102, which encloses a cavity 104, and which comprises a base part 106 and a light outlet member 108. The light outlet member is attached to the base part 106 by means of a seal 110 arranged to seal the cavity 104. The LED device 100 further comprises a getter 112, which is attached to the base part 106 in the cavity 104, a LED element 114, which is attached to the base part 106 in the cavity 104, and which comprises one or, as in the shown embodiment, several LEDs 114a, and a remote organic phosphor element 116, which is attached to the base part 106 in the cavity 104. The base part 106 further comprises or supports for instance electrical terminals and drive electronics, as understood by the person skilled in the art, although not explicitly shown.

The remote organic phosphor element 116 is advantageous compared to traditional inorganic phosphors. However, certain gases, typically oxygen, make such a phosphor element degrade undesirably fast. Therefore, commonly a hermetic seal and vacuum or an inert gas in the cavity has been used in order to keep up the life time of the phosphor element. Furthermore the phosphor material has been integrated with the LED element, like in the above-mentioned prior art LED assembly. However, when manufacturing different kinds of lamps having different shapes and light properties it is advantageous to arrange the phosphor as a remote element, like in accordance with the present invention. In addition, it has been found that the phosphor material degradation is slower when the phosphor is applied remote instead of integrated with the LED element, because of inter alia the lower temperature. It is possible provided that it is also possible to keep the detrimental gas out of the cavity 104. On the other hand, hermetic sealing under vacuum or an inert atmosphere is relatively difficult and costly. The solution according to the present invention provides for a simpler structure, although in its most general concept, it does not exclude hermetic sealing. The seal 110 extends along the rim of the light outlet member 108, which in this embodiment is a dome. It should be noted that throughout this application the light outlet member comprises one or more walls, which is/are made of a light passing material, e.g. glass or an appropriate plastic or a barrier film, as understood by the person skilled in the art. The getter 112 is made of a solid material and is arranged adjacent to the seal 110. The position is chosen inter alia in order to avoid that the getter 112 interferes with an output light path, i.e. the light that is output from the LED device 100. The getter can be placed behind a reflector. The getter itself can also be made reflective.

The getter 112 is able to absorb a gas which enters the cavity. The getter is arranged to absorb a gas that would be detrimental to the organic phosphor element 116. With this structure of the LED device 100 it is possible to provide a non-hermetic seal, i.e. a permeable seal.

The solid getter is typically an oxygen getter made of, for example, silicon, divalent iron oxide, barium, calcium, or aluminium. It is also possible to use organic anti oxidants, such as vitamin C. As an example of an alternative getter 112, it comprises a hydrogen dispenser and a moisture collector. Thereby any oxygen in the controlled atmosphere within the cavity 104 will react with the hydrogen, form moisture/water and be removed by means of the getter 112.

The permeable seal is typically an organic adhesive, such as an epoxy adhesive. It should be noted that indeed the permeability is kept low, while still avoiding the additional cost of providing a seal that guarantees a hermetic seal for a long time.

Preferably, the cavity 104 is filled with an oxygen free atmosphere containing one or more inert gases chosen among argon, neon, nitrogen, and helium.

Referring to the embodiment shown in FIG. 1, the remote organic phosphor element 116 is formed like a dome shaped hood, as is the light outlet member 108, and the oxygen free atmosphere is filled in the whole cavity, i.e. both between the remote organic phosphor element 116 and the base part 106 and between the remote organic phosphor element 116 and the light outlet member 108. Furthermore, the getter 112 is arranged between the remote organic phosphor element 116 and the light outlet member 108.

In addition to the at least one inert gas in the cavity 104, it is possible to add a further gas, which reacts with oxygen in the cavity 104 which leaks into the cavity or comes out of components when the LED device is operated. For instance, LED components or other parts arranged in the cavity 104 may produce a gas, single or compound, which compromises operation or life time of the LED device 100. It is then possible to choose a reactant gas, which reacts chemically with the compound gas and produces a stable component or a component that can easily be absorbed by an additional getter 118, illustratively shown on the base part 106 between the LEDs 114a. If applicable, the additional getter 118 can be arranged to directly absorb the produced gas. Furthermore, alternatively the reactant gas can be dispensed a bit at a time by means of a dispenser arranged in the cavity, as shown at 320 in FIG. 3.

The remote organic phosphor element 116 when being a separate part inside the cavity can be formed by for example injection molding.

Preferably, the LEDs 114a are blue light emitting LEDs, and the remote organic phosphor element 116 is arranged to convert the blue light into white light.

What has been described so far as regards the properties of the controlled atmosphere, the getter, the sealant, and the remote organic phosphor element is true in general for all embodiments, unless nothing else is explicitly or implicitly stated.

Referring to FIGS. 2 and 3, in further embodiments the LED device is provided as a retrofit lamp. The LED device 200, 300 has a base part 206, 306, which is provided with a traditional cap 207, 307, such as an Edison screw cap or a bayonet cap. Further, the LED device 200, 300 has a bulb shaped light outlet member 208, 308 enclosing the cavity 204, 304. In one embodiment, see FIG. 2, the remote organic phosphor element 216 is arranged as a separate hood shaped part inside of the light outlet member 208. The remote organic phosphor element 216 covers the LED element 214 at a distance from the light outlet member 208. The getter 212 is arranged between the remote organic phosphor element 216 and the light outlet member 208, adjacent to the seal 210. Thereby the getter 212 does not interfere with the output light path. In the other embodiment, see FIG. 3, the remote organic phosphor element 316 is arranged as a coating on the inside of the light outlet member 308, the getter 312 being thus positioned inside of the phosphor element 316, and close to the seal 310.

In an alternative embodiment, as shown in FIG. 4, the LED device 400 has an outer casing comprising a flat base part 406 and a dome shaped light outlet member 408. However, in this embodiment the light outlet member 408 comprises a sandwich structure of an outer wall 422, an inner wall 424, and the remote organic phosphor element 416 arranged between the outer wall 422 and the inner wall 424. The outer and inner walls 422, 424 are connected with the base part and with each other by means of the seal 410 extending along circumferential edge portions 426, 428 of the inner and outer walls 422, 424. The light outlet member 408 thereby forms the sealed cavity 404 between the spaced outer and inner walls 422, 424. The getter 412 is arranged in the cavity adjacent to the seal 410 in order not to interfere with the light output of the LED device 400. The light outlet member 408 defines a second cavity, or a further compartment 430 between an inner surface 432 of the base part, on which the LEDs 414a are mounted and the inner wall 424. Since there are no air sensitive components within the further compartment 430 it does not have to be provided with a special environment but can contain air. However it is also possible to initially provide the further compartment 430 with the same atmosphere as the cavity 404, since the further compartment is in fact sealed off from the environment by the seal 410, because it is additionally used to attach the light outlet member 408 to the inner surface of the base part 406.

Figure 5:
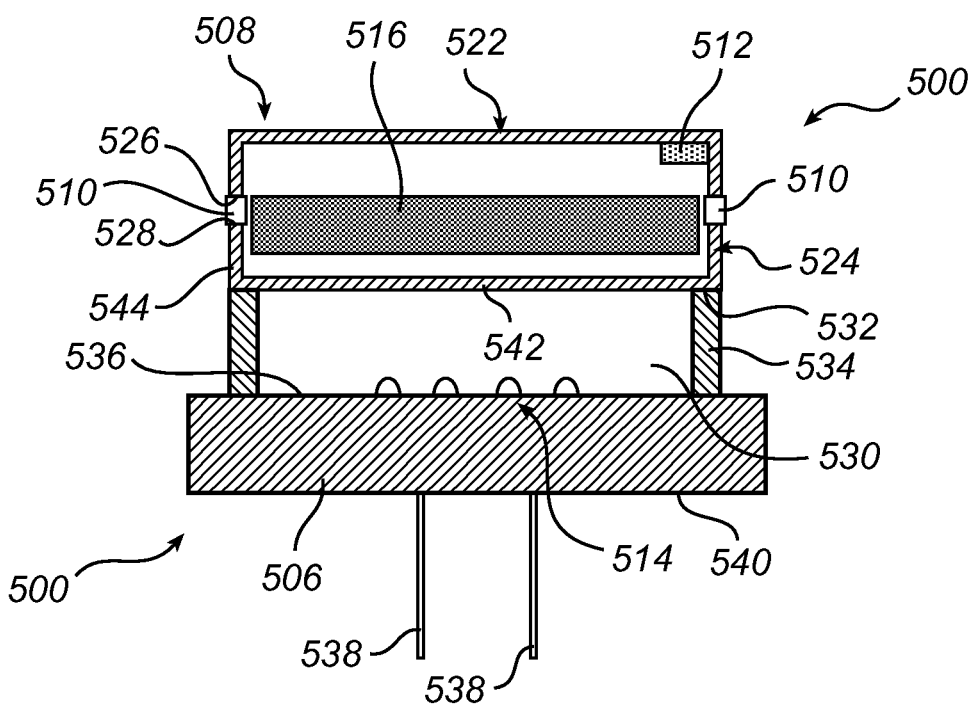

According to a further embodiment of the LED device 500 as shown in FIG. 5, the light outlet member 508 is arranged as a plane sandwiched structure, forming a cassette, and comprising an outer wall 522, an inner wall 524, and the remote organic phosphor element 516 placed in between the outer and inner walls 522, 524. Each one of the outer and inner walls 522, 524 is lid shaped with a circular plane portion 542 and a cylindrical border portion 544 extending perpendicular to the plane portion along the circumference thereof. The outer and inner walls 522, 524 are attached to each other by means of a seal 510 along the edges 526, 528 of their cylindrical border portions 544. The inner wall 524 is attached, on a circumferential surface edge portion 532 of its plane portion 542, to a cylindrical reflector wall 534, at one end of the cylindrical reflector wall 534. The other end of the reflector wall 534 is attached to the inner surface 536 of the base part 506. The inner wall 524 of the outlet member 508, the reflector wall 534, and the inner surface 536 of the base part 506 define a further compartment 530, which, like in the previous embodiment, has a non-critical environment. LEDs 514 are mounted on the inner surface 536 of the base part 506 and within the further compartment 530. A getter 512 is arranged within the space of the cassette 508. Electric terminals 538 protrude from an outer surface 540 of the base part 506. Alternatively, the remote organic phosphor element 516 could be arranged as a coating on the inner wall 524 of the light outlet member 508. It is possible to provide an alternative embodiment where the cassette is hermetically sealed and the getter is omitted, or the getter is still employed.

Figure 6:
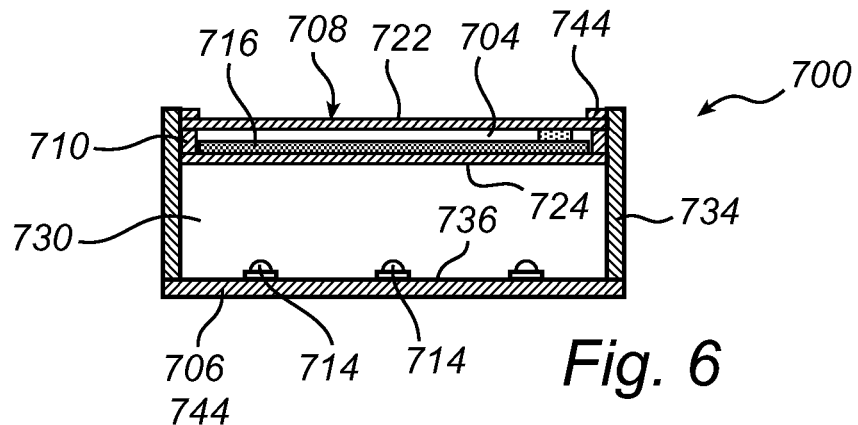
Figure 7:
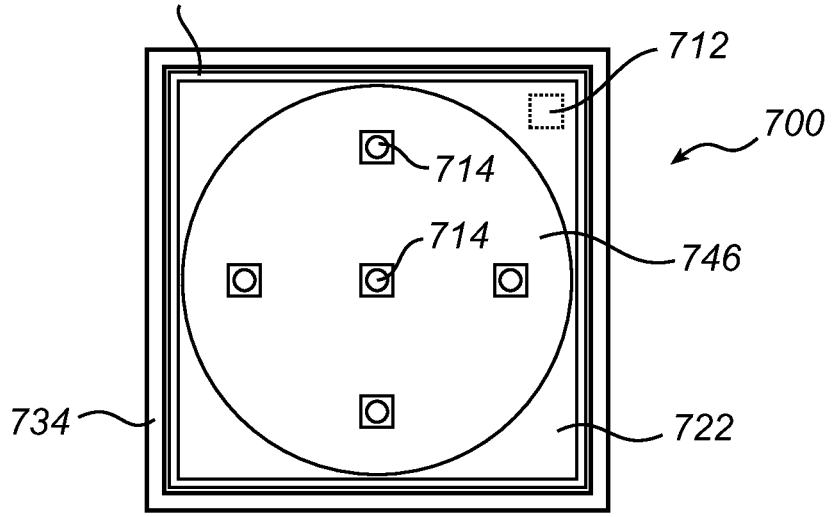
FIG. 7 is a top view of an embodiment of a light emitting diode device according to the present invention.

According to a further embodiment of the LED device 700 shown in FIGS. 6 and 7, a similar cassette type of light outlet member 708 as in the previous embodiment is employed. The outlet member 708 has an outer wall 722, an inner wall 724, each consisting of a plane square plate, a seal 710 interconnecting the outer and inner walls 722, 724 at a distance from each other, thereby forming a cavity 704 therein, a remote organic phosphor element 716, constituted by a layer deposited on the inner wall 724, and a getter 712 arranged in the cavity 704 at a corner of the outlet member 708. A reflector wall 734 forming a square tube is arranged on the base part 706. The reflector wall 734 has a peripheral lip 744 at the outer end thereof, the lip 744 extending perpendicular to the reflector wall 734 towards the centre axis of the tube. Edge surfaces of the light outlet member 708 are attached to the inner surface of the reflector wall 734 at an end portion close to an outer end thereof, and to the lip 744 on its inside, or lower surface. The reflector wall 734 can also be circular. Like in the similar above embodiments the cavity of the light outlet member 708 is provided with a controlled atmosphere guarded by the permeable seal 710 and the getter 712. The light outlet member 708, the tubular reflector wall 734, and the base part 706 define a further compartment 730, housing the LED element comprising five LEDs 714 arranged on the inner surface 736 of the base part 706. Thus, as a whole the LED device 700 is block shaped and has a square light outlet member 708. However, in order to hide the getter 712 the outer wall 722 of the light outlet member 708 has been made light non-transmissive at corner portions thereof leaving a circular outlet window 746 for light passage. Additionally, the circular outlet window 746 provides a comfortable light cone as output light. An alternative embodiment with hermetic seal is possible to provide as well, and then the getter can be either employed or omitted.

Figure 8:
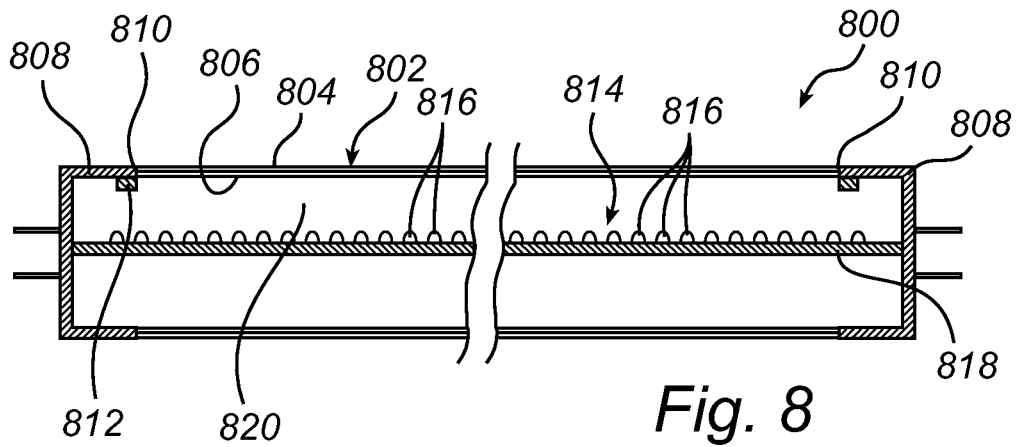
FIG. 8 is a cross-sectional view of a further embodiment of a light emitting diode device according to the present invention.

According to a further embodiment the LED device 800 shown in FIG. 8 is provided as a retrofit TL tube. A light outlet member 802 comprises a glass tube 804 and an organic phosphor element 806 constituted by a phosphor layer deposited on the inner surface of the glass tube 804. Alternatively, the organic phosphor element 806 is a separate phosphor element arranged adjacent to the inner surface of the glass tube 804. End caps 808 are attached to the ends of the light outlet member 802 by means of a seal 810 to form an outer casing and to define a sealed cavity 820. Getters 812 are mounted on the inside of the caps 808 close to the seal 810. A LED element 814 comprising several LEDs 816 is arranged in the cavity 820 and is arranged on a base part 818, which in turn is attached to the end caps 808. The cavity contains a controlled atmosphere as described above.

Figure 9:
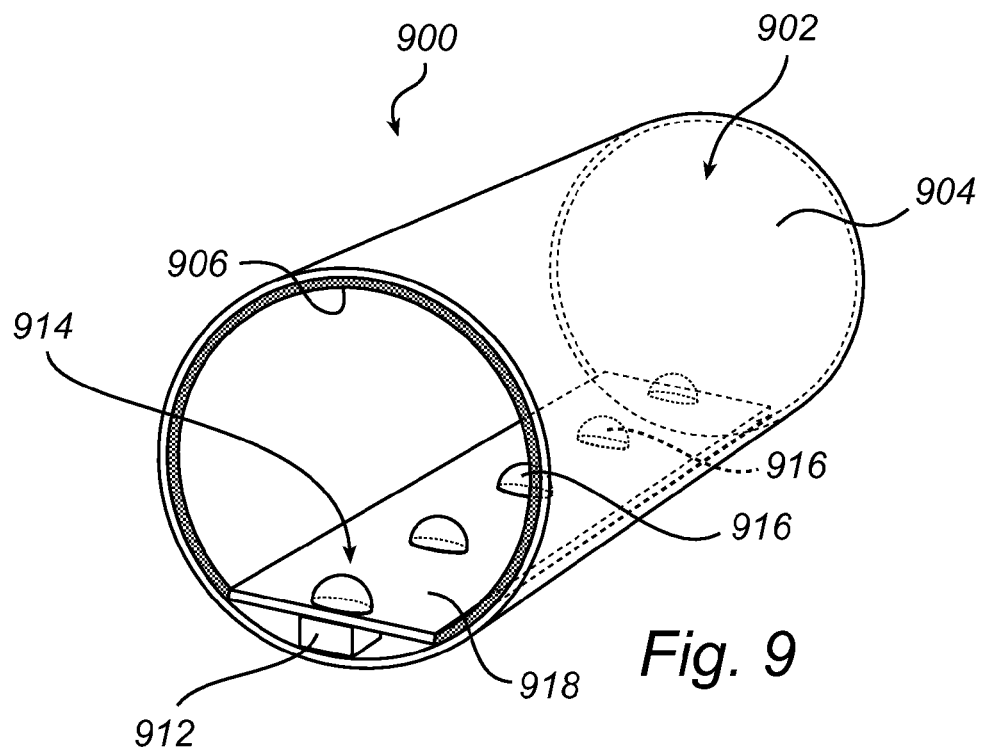
FIG. 9 is a partly cut away perspective view of a further embodiment of a light emitting diode device according to the present invention.

According to another embodiment of the LED device 900, similar to the retrofit TL tube embodiment described above, the light outlet member 902 comprises a glass tube 904, the light emitting diode element 914 is elongate, is provided with several LEDs 916 in a row, and extends along the length of the glass tube 904, see FIG. 9. The LEDs 916 are placed on a base part, which is a reflective substrate, 918, and which is comprised in the LED element 914. The remote organic phosphor element 906 is a film, which has been inserted into the glass tube 904 around the LED element 914. The base part 918 is arranged close to the inner surface of the glass tube 904, a rear side of the base part facing the inner surface, and with the LEDs 916 mounted on the opposite front side of the base part 918. The getter 912 is mounted between the rear side of the base part 918 and the glass tube 904. Thereby the getter 912 does not interfere with an output light path of the LED device 900. The tube can be sealed hermetically or using a permeable sealant.

Figure 10:
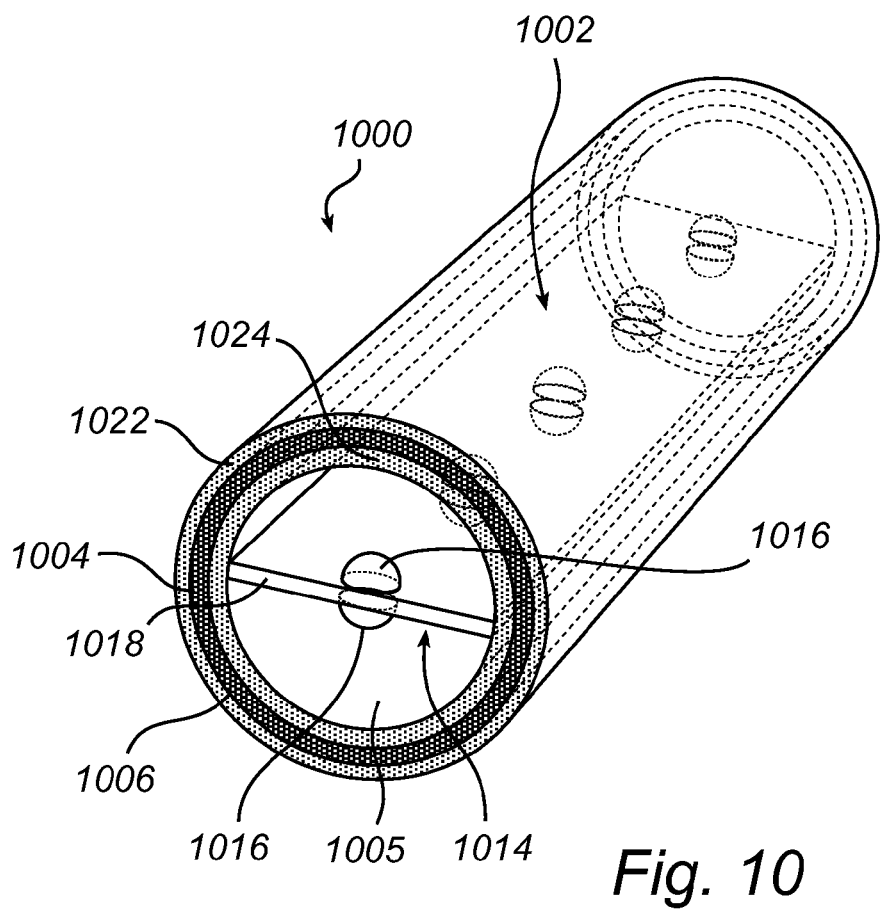
FIG. 10 is a partly cut away perspective view of a further embodiment of a light emitting diode device according to the present invention.

According to a further embodiment of the LED device 1000, as shown in FIG. 10, the light outlet member 1002 comprises two concentric outer and inner glass cylinders 1022, 1024. The glass cylinders 1022, 1024 are sealed at their ends and define the cavity 1004 wherein the remote organic phosphor element 1006 and a getter is arranged. The remote organic phosphor element 1006 is cylindrical as well. The LED element 1014 is arranged centrally of the light outlet member 1002, in a further compartment 1005 within the inner glass cylinder 1024, and comprises a base part 1018, and LEDs 1016, which are mounted on opposite sides of the base part 1018. Here again the sealing can be hermetic. The further compartment 1005 can be exposed to air.

Above, embodiments of the LED device according to the present invention as defined in the appended claims have been described. These should be seen as merely non-limiting examples. As understood by a skilled person, many modifications and alternative embodiments are possible within the scope of the invention.

In the embodiments where the light outlet member houses the cavity that contains the organic phosphor element, and a separate, or further, space is arranged for inter alia housing the light emitting diode element, furthermore the cavity of the light outlet member can be hermetically sealed. In this way degassing or oxygen production by elements such as the LEDs or a diffuser, which can lead to the degradation of the organic phosphor, can be avoided. In such an embodiment where the organic phosphor is hermetically sealed in an inert gas atmosphere the amount of getter may be very low or it may even be excluded.

It should be noted that in some embodiments the driver electronics or other elements such as a sensor may also be in the LED device close to the LEDs.

It is to be noted, that for the purposes of this application, and in particular with regard to the appended claims, the word "comprising" does not exclude other elements or steps, that the word "a" or "an", does not exclude a plurality, which per se will be apparent to a person skilled in the art.

The invention claimed is:

1. A light emitting diode device comprising
   an outer casing,
   a light emitting diode element, comprising at least one light emitting diode, arranged within the outer casing,
   a light outlet member constituting a part of the outer casing,
   a sealed cavity containing a controlled atmosphere,
   a seal arranged to seal the cavity,
   a remote organic phosphor element arranged in the sealed cavity,
   a getter arranged in the sealed cavity, and
   a base part, wherein the light outlet member comprises an outer shell, which is attached to the base part by means of the seal, wherein the light emitting diode element is arranged on the base part, wherein the organic phosphor element constitutes a hood, which covers the light emitting diode element and which is arranged between the light emitting diode element and the outer shell, and wherein the getter is arranged between the phosphor hood and the outer shell.

2. The light emitting diode device according to claim 1, wherein the getter is arranged to remove oxygen from the controlled atmosphere.

3. The light emitting diode device according to claim 1, wherein the getter is arranged adjacent to the seal.

4. The light emitting diode device according to claim 1, wherein the getter is arranged in a position where it does not interfere with an output light path.

5. The light emitting diode device according to claim 1, wherein the getter includes a hydrogen gas dispenser.

6. The light emitting diode device according to claim 1, wherein the seal is non-hermetic and permeable to oxygen.

7. The light emitting diode device according to claim 1, wherein the organic phosphor element is a separate element.

8. The light emitting diode device according to claim 1, wherein the light outlet member comprises an outer wall and an inner wall, attached to the outer wall by means of the seal, thereby forming the cavity, wherein the organic phosphor element and the getter are arranged in the cavity between the walls, and wherein the light emitting diode device comprises a further compartment, housing the light emitting diode element.

9. The light emitting diode device according to claim 8, wherein the light outlet member forms a lid covering a further compartment, wherein the further compartment comprises a surrounding wall and a bottom plate, wherein the surrounding wall extends between the bottom plate and the light outlet member, and wherein the light emitting diode element is arranged on the bottom plate.

10. The light emitting diode device according to claim 8, wherein the outer casing is arranged as a retrofit lamp.

11. The light emitting diode device according to claim 8, wherein the light outlet member comprises a cylindrical glass tube, wherein the outer casing further comprises end caps sealingly attached to the cylindrical glass tube.

12. The light emitting diode device according to claim 8, wherein the controlled atmosphere comprises a reactant gas arranged to react with a substance to be produced within the sealed cavity during the operation of the light emitting diode device.

13. The light emitting diode device according to claim 12, further comprising a dispenser arranged to dispense the reactant gas.

14. A light emitting diode device comprising
   an outer casing,
   a light emitting diode element, comprising at least one light emitting diode, arranged within the outer casing,
   a light outlet member constituting a part of the outer casing,
   a sealed cavity containing a controlled atmosphere,
   a seal arranged to seal the cavity,
   a remote organic phosphor element arranged in the sealed cavity, and
   a getter arranged in the sealed cavity, wherein the light outlet member comprises an outer wall and an inner wall, attached to the outer wall by means of the seal, thereby forming the cavity, wherein the organic phosphor element and the getter are arranged in the cavity between the walls, and wherein the light emitting diode device comprises a further compartment, housing the light emitting diode element.

* * * * *